(12) United States Patent
Tillmann et al.

(10) Patent No.: US 7,041,610 B1
(45) Date of Patent: May 9, 2006

(54) METHOD AND APPARATUS FOR THE THERMAL TREATMENT OF SUBSTRATES

(75) Inventors: Andreas Tillmann, Tomerdingen (DE); Uwe Kreiser, Ulm (DE)

(73) Assignee: Steag RTP Systems GmbH (DE)

( * ) Notice: Subject to any disclaimer, the term of this patent is extended or adjusted under 35 U.S.C. 154(b) by 198 days.

(21) Appl. No.: 10/111,737

(22) PCT Filed: Oct. 19, 2000

(86) PCT No.: PCT/EP00/10290

§ 371 (c)(1),
(2), (4) Date: Sep. 17, 2002

(87) PCT Pub. No.: WO01/31689

PCT Pub. Date: May 3, 2001

(Under 37 CFR 1.47)

(30) Foreign Application Priority Data

Oct. 28, 1999 (DE) .......................................... 199 52 017

(51) Int. Cl.
*H01L 21/26* (2006.01)
*H01L 21/324* (2006.01)
*H01L 21/42* (2006.01)

(52) U.S. Cl. ........................ 438/795; 438/308; 438/799; 250/492.2; 250/492.22

(58) Field of Classification Search ................. 438/308, 438/795, 799; 250/492.2, 492.22
See application file for complete search history.

(56) References Cited

U.S. PATENT DOCUMENTS

| 4,891,488 A | 1/1990 | Davis et al. |
| 4,958,061 A * | 9/1990 | Wakabayashi et al. ...... 219/411 |
| 4,981,815 A * | 1/1991 | Kakoschke ..................... 438/5 |
| 5,253,324 A | 10/1993 | Wortman et al. |
| 2002/0017618 A1 * | 2/2002 | Gat et al. ................. 250/492.2 |

FOREIGN PATENT DOCUMENTS

| DE | 4223133 | 1/1993 |
| DE | 4437361 | 4/1996 |
| DE | 19737802 | 3/1999 |
| DE | 19821007 | 11/1999 |
| WO | WO 00/41223 | 7/2000 |

* cited by examiner

*Primary Examiner*—Amir Zarabian
*Assistant Examiner*—Pamela Perkins
(74) *Attorney, Agent, or Firm*—R W Becker & Associates; R. W. Becker

(57) ABSTRACT

In order to achieve temperature distribution, in particular a homogeneous temperature distribution in, for example, a substrate during a thermal treatment process of said substrate, a method is disclosed for the thermal treatment of substrates, in particular semi-conductor wafers, in a process chamber comprising at least one temperature distribution influencing element located in the process chamber. During thermal treatment, the spatial arrangement of the element is altered relative to the substrate and/or to the process chamber. A device for the thermal treatment of substrates in a process chamber is also disclosed, comprising at least one temperature distribution influencing element located in a process chamber wherein a device is provided in order to alter the spatial arrangement of the element relative to the substrate and/or to the process chamber during the thermal treatment process.

20 Claims, 7 Drawing Sheets

METHOD AND APPARATUS FOR THE THERMAL TREATMENT OF SUBSTRATES

BACKGROUND OF THE INVENTION

The present invention relates to a method and an apparatus for the thermal treatment of substrates, especially semiconductor wafers, in a process chamber having at least one element in the process chamber that influences the temperature distribution.

Such an apparatus is known, for example, from DE-A-197 37 802 of the same applicant. With this apparatus, a light-permeable process chamber is provided for receiving semiconductor wafers that are to be thermally treated. Provided outside of the process chamber are banks of heating lamps in order to vary the temperature of the substrate that is disposed in the process chamber. To achieve certain process results, in particular to achieve a homogeneous temperature distribution within the substrate, there is provided in the process chamber a compensation ring, which surrounds the substrate in a plane parallel to it, as well as a light-transforming plate, which is also designated as a hotliner, that is held spaced form the substrate and extends parallel thereto. The objective of the compensation ring is to prevent edge effects that occur during the thermal treatment of the wafer. Thus, for example, there is prevented a more rapid heating-up at the rim relative to the inner portion of the wafer during a heating-up phase, and a more rapid cooling off during a cooling-off phase. In this connection, it is known to construct the compensation ring from a plurality of individual segments, as is described, for example, in the not prepublished DE-A-198 21 007, which belongs to the same applicant.

The function of the hotliner is to absorb the light radiation emitted from a bank of heating lamps, as a result of which the hotliner is heated and itself emits a thermal radiation in order to heat the wafer. This indirect heating of the wafer serves to shield at least one surface of the wafer from a direct light irradiation, as a result of which in particular structures formed on the wafer are protected. The function of such a hotliner can be ascertained, for example, from DE-A-4 437 361, reference to which is made to avoid repetition.

With all of these apparatus, the elements that influence the temperature distribution, such as, for example, the compensation ring and/or the light-transforming plate, are provided such that during the thermal treatment they are held rigid and parallel to a plane of the wafer. Merely in DE-A-198 21 007 is a movement of the compensation ring described that serves to permit access to the semiconductor wafer during the removal and the insertion of the wafer.

Proceeding from the aforementioned apparatus it is an object of the present invention to provide a method and an apparatus for the thermal treatment of substrates with which an improved temperature homogeneity is achieved.

SUMMARY OF THE INVENTION

Pursuant to the present invention, the object is realized with a method of the aforementioned type in that during the thermal treatment, a spatial arrangement of the elements that influence the temperature distribution is varied relative to the substrate and/or to the process chamber. In so doing, the temperature distribution within the process chamber during the thermal treatment, and hence the temperature distribution upon or in the substrate, can be varied and can be adapted to the given process conditions in a simple and effective manner. In particular, it is possible to homogenize the temperature distribution upon or in the substrate.

Pursuant to one preferred embodiment of the invention, a relative movement for varying the arrangement is controlled as a function of the temperature curve of the thermal treatment, and thus a temperature distribution that is adapted to the temperature curve is achieved. The element is preferably moved relative to the substrate and/or to the process chamber. A movement of the element has, in contrast to the movement of the substrate, a lesser danger of damage to the substrate and is therefore preferred. The movement is preferably a tilting, pivoting and/or displacement movement, whereby the displacement movement is not limited to a movement with respect to height, but also includes lateral movements.

Pursuant to a particularly preferred embodiment of the invention, an element is a compensation element, especially a compensation ring, that at least partially surrounds the substrate in a plane parallel to it, and that serves to influence edge effects that occur during the thermal treatment of the wafer. In this connection, the element is preferably comprised of a plurality of segments, especially ring segments, at least one of which is moved. By providing a plurality of segments, an improved control of the temperature distribution within the process chamber, and upon or in the substrate, is achieved. For an improved control of the temperature distribution, the movement of each segment is controlled as a function of the arrangement of at least one other segment. Furthermore, a plurality of segments have the advantage that the compensation element can be economically produced.

For a simplified construction of the apparatus, and a simplified control, at least two segments are moved simultaneously. In this connection, the segments are preferably disposed in pairs diametrically across from one another relative to the substrate, and the oppositely disposed segment pairs are moved simultaneously, thereby achieving symmetry relative to the substrate.

Depending upon the geometry of the chamber, it can also be advantageous to pivot the segments about an axis that does not extend through an axis of symmetry of the substrate, as this is described in the previously mentioned DE-A-198 21 007.

In order to shield the substrate from a direct, light irradiation, an element is preferably a light-transforming plate that absorbs light radiation of a heating device and emits thermal radiation in order to indirectly heat the substrate.

Pursuant to one embodiment of the invention, the spatial arrangement of at least two elements is varied relative to the substrate and/or to the process chamber, as a result of which a good control of the temperature distribution within the process chamber and on or in the substrate is achieved. Pursuant to a further embodiment of the invention, at least one element and the substrate are moved in order to influence the temperature distribution on or in the substrate.

The object of the invention is also realized with an apparatus of the aforementioned type according to which a device for varying a spatial arrangement of the element that influences the temperature distribution relative to the substrate and/or to the process chamber during the thermal treatment is provided. With this apparatus, the advantages already mentioned in conjunction with the method result.

In order to influence edge effects during the thermal treatment of the substrate, an element is preferably a compensation element, especially a compensation ring, that essentially surrounds the substrate in a plane. In this connection, the compensation ring is preferably disposed at an angle to the plane of the substrate, as a result of which a shadow effect is produced on the edges of the wafer that in particular prevents a too rapid heating-up of the edge portion during very high heating-up rates.

The object is furthermore realized with an apparatus of the aforementioned type in that at least one element is disposed at an angle relative to the plane of the substrate in order to achieve a particular influencing of the temperature distribution. In this connection, an element is preferably a compensation element, especially a compensation ring, that essentially surrounds the substrate and that produces a shadow effect upon the edges of the wafer relative to a heating device, and thus prevents a too rapid heating-up of the edge region, especially at very high heating-up rates. An element is preferably a light-transforming plate.

BRIEF DESCRIPTION OF THE DRAWINGS

The invention will subsequently be described in greater detail with the aid of the drawings. The drawings show.

DESCRIPTION OF PREFERRED EMBODIMENTS

Figure 1:
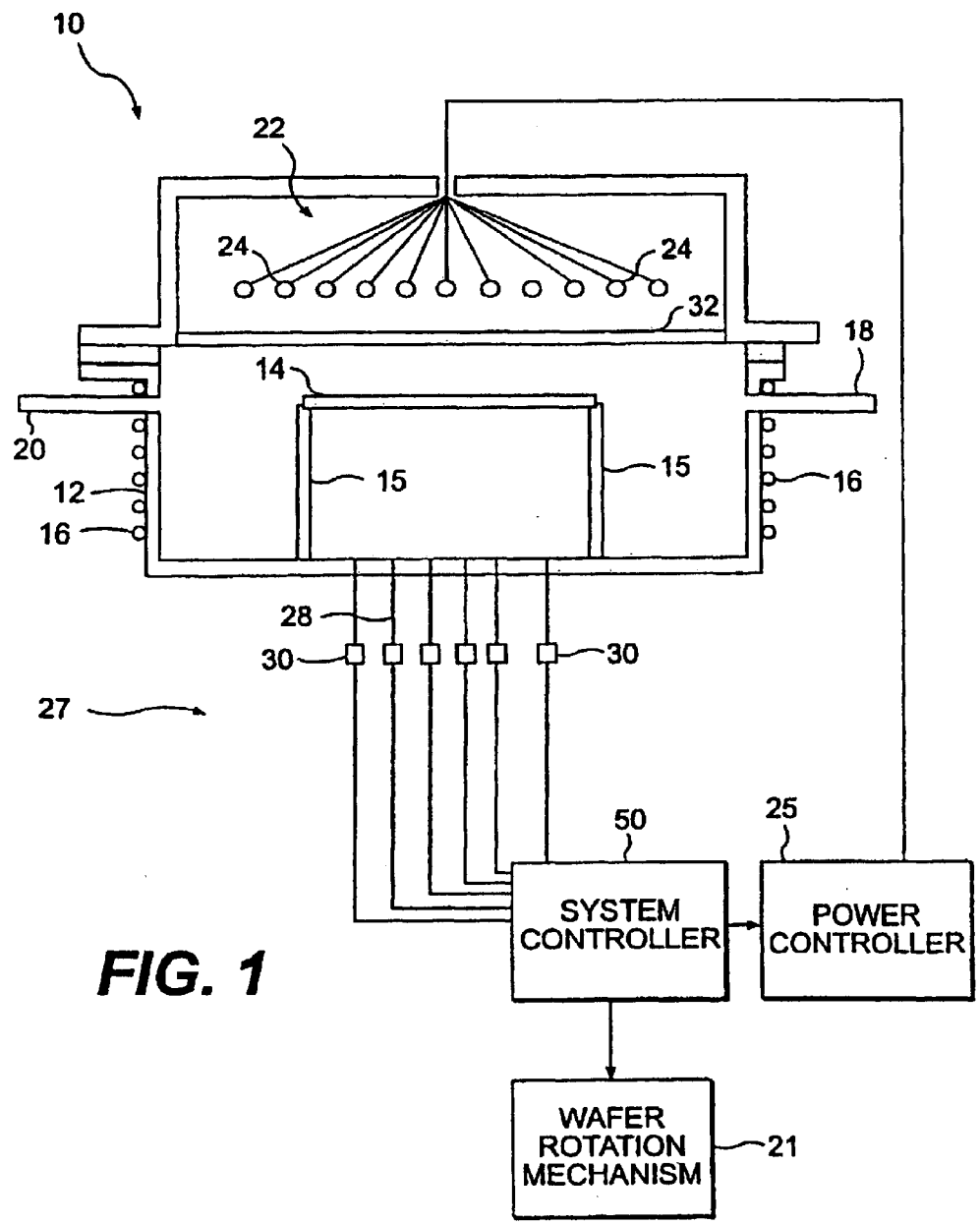
FIG. 1 an apparatus for the thermal treatment of semiconductor wafers pursuant to a first embodiment of the invention in a first position.

FIG. 1 shows a schematic cross-sectional side view of an apparatus 1 for the thermal treatment of semiconductor wafers 2. The apparatus 1 has a process chamber 3 that on its upper and lower sides is preferably provided with walls 5 and 6 respectively that are produced of quartz glass. Provided above the wall 5 is a bank of lamps or chamber 7, which can have reflector surfaces and in which is provided a heat source in the form of a plurality of lamps 8. Provided below the wall 6 is again a bank of lamps or chamber 9 similar to the chamber 7, in which is provided a heat source in the form of lamps 10.

The side walls of the process chamber can be provided with dielectric coatings in order, for example, to achieve a certain mirror effect for at least a portion of the electromagnetic spectrum that is present in the chamber. In addition, one of the side walls includes a process chamber door in order to make possible the introduction and removal of the semiconductor wafer 2.

Provided within the process chamber is a first, lower light-transforming plate 12—also known as a hotliner—that extends parallel to the lower process chamber wall 6. Provided on an upper side of the light-transforming plate 12 are spacers 13 on which the semiconductor wafer 2 is placed, so that it is held parallel to and spaced from the lower light-transforming plate 12.

Provided above the semiconductor wafer 2 is a further light-transforming plate 16 that in a first position, illustrated in FIG. 1, is held parallel to and spaced from the semiconductor wafer. The light-transforming plates 12,16 are comprised of a material having a high light-absorption coefficient, which serves to absorb the light emitted or radiated from the lamps 8,10, in order to subsequently give off a thermal radiation for heating the semiconductor wafers 2.

Figure 2:
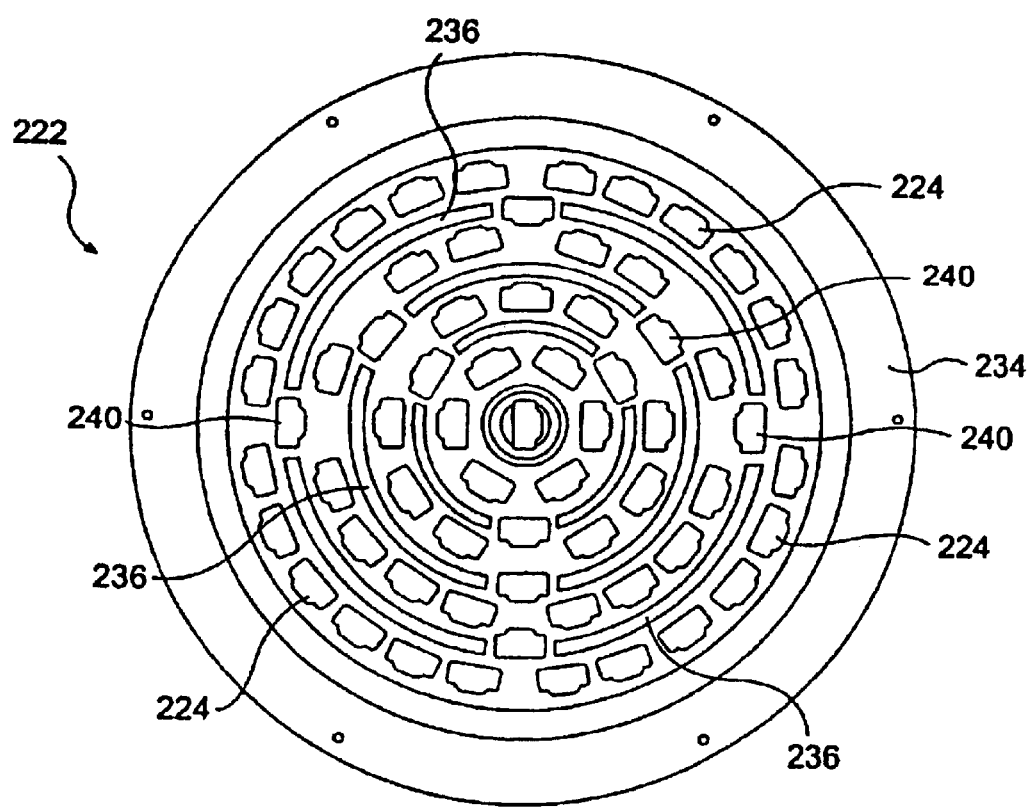
FIG. 2 the apparatus of FIG. 1 in a second position.

As illustrated in FIG. 2, the position of the upper light-emitting plate 16 can be varied relative to the semiconductor wafer 2 and the process chamber. The upper light-emitting plate 16 is disposed at an angle relative to the semiconductor wafer 2 in FIG. 2 in order to vary the temperature distribution within the chamber and hence upon or in the substrate. This inclined position of the upper light-emitting plate 16 is established during the thermal treatment of the wafer 2, and the degree of the inclined position is established as a function of the temperature curve of the thermal treatment and/or of a temperature distribution on or in the substrate, which is measured by a suitable measurement device, such as a non-illustrated pyrometer.

A further advantage of such an inclined plate is that controlled influence can be undertaken therewith upon process gas streams. This is then always advantageous if the process gas is dissociated on the hot wafer surface, and the dissociation products react with the wafer. By way of example is the oxynitridation of silicon, for example with $H_2O$, where the $H_2O$ flows parallel to the wafer. To achieve very homogeneous oxynitride layers, up to now it has been necessary to considerably reduce the gas flow at the reaction temperature (700° C.–1150° C.). However, the controlled reduction of the process gas flow is technically more complicated than is the controlled tilting of the light-emitting plate 16. With a plate that is tilted relative to the wafer, it is possible at a constant process gas flow to achieve similarly good homogeneity of the oxynitride layers as is the case with flow reduction. A combination of flow reduction and tilting provides optimum homogeneity.

Although this is not illustrated in FIGS. 1 and 2, the lower light-transforming plate 12 could also be movably disposed within the process chamber 3 in order to achieve a further variation of the temperature distribution within the process chamber. Thus, for example, with a rigid arrangement of the upper light-emitting plate and an inclined position of the lower light-emitting plate 12, an inclined position can be achieved between the wafer 2 and the upper light-emitting plate 16. Instead of an inclined position of the light-emitting plate, it would also be possible to simply reduce the spacing between one of the light-emitting plates and the substrate 2 in order, for example, to bring the upper light-emitting plate 16 closer to the semiconductor wafer 2 in order to achieve a greater heating upon the upper side of the wafer 2 relative to the underside.

It would furthermore be possible to rigidly arrange both of the light-emitting plates 12,16 within the process chamber 3, and to hold the wafer 2 movable relative to the plates, for example via the spacers 13, which can, for example, be embodied as telescopic rods, the height of which can be adjusted independently of one another in order to dispose the wafer 2 at an angle relative to the light-emitting plates 12,16.

Figure 3:
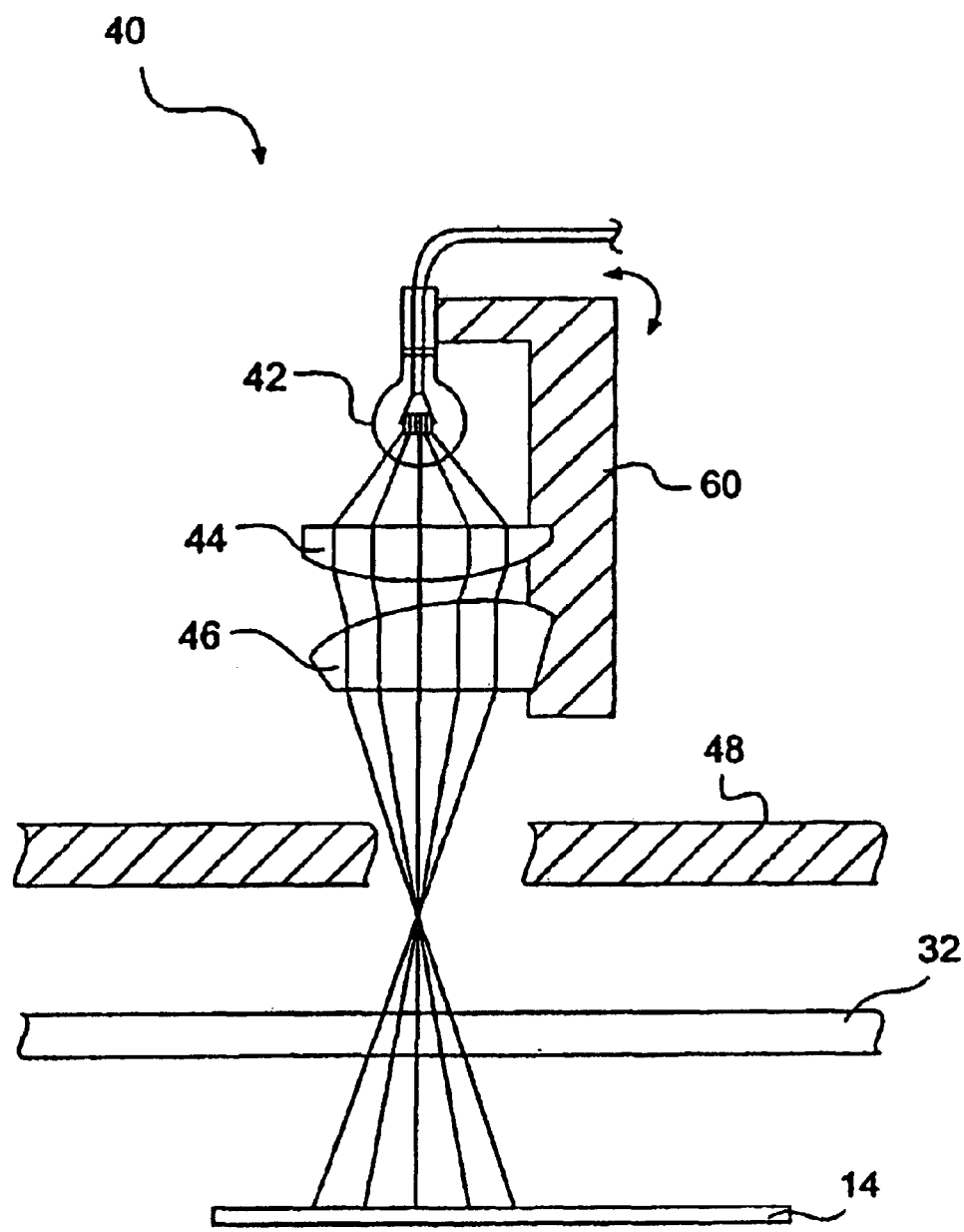
FIG. 3 an apparatus for the thermal treatment of semiconductor wafers pursuant to a second embodiment in a first position.
Figure 4:
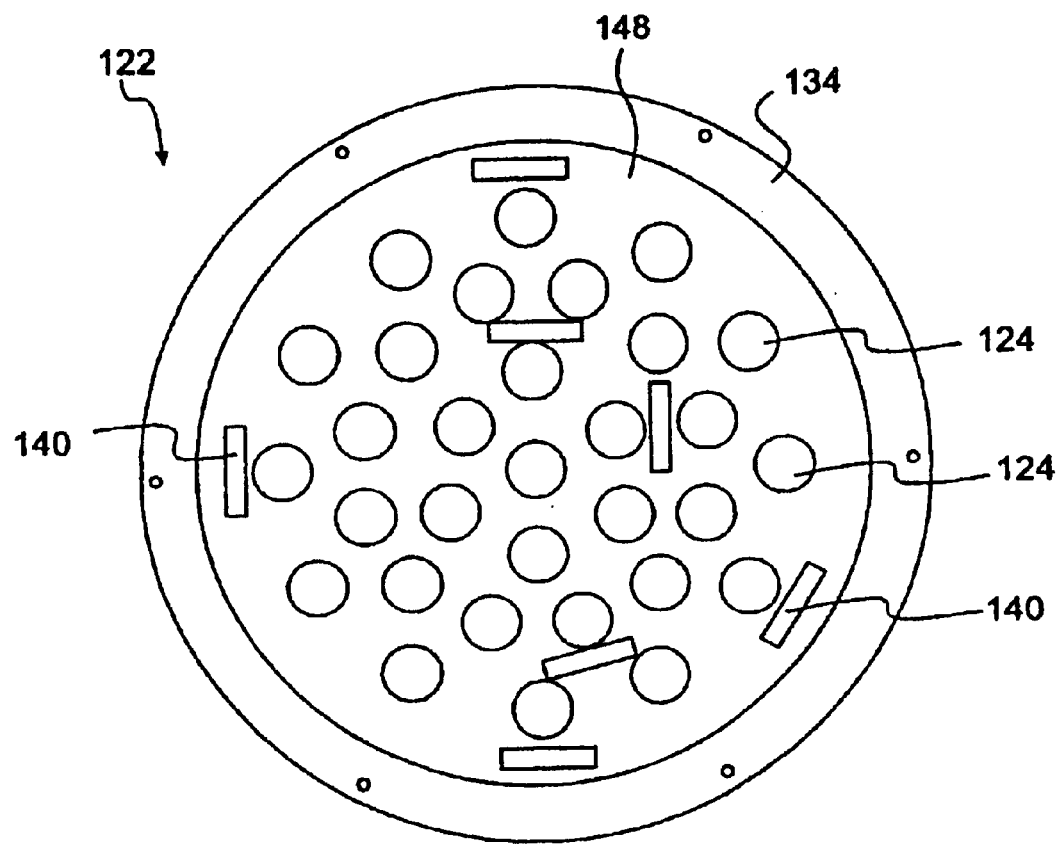
FIG. 4 the apparatus of FIG. 3 in a second position.

FIGS. 3 and 4 illustrate a further embodiment of the thermal treatment apparatus 1 pursuant to the present invention. In FIGS. 3 and 4, the same reference numerals are used as with the first embodiment to the extent that the same or similar components are in question.

The apparatus 1 has essentially the same construction as does the apparatus 1 of the first embodiment, and differs from the apparatus of FIG. 1 only in that instead of an upper light-transforming plate 16, a compensation ring 20 that surrounds the wafer 2 is provided. The compensation ring 20 surrounds the wafer 2 with a slight spacing, and thus prevents rim effects during the heating up and the cooling down of the wafer 2 by preventing a more rapid heating up in a heating phase as well as a rapid cooling off in a cooling phase. As illustrated in FIG. 3, the compensation ring 20 is disposed in essentially the same plane as the semiconductor wafer 2; however, it can also be disposed somewhat above or below the wafer.

As illustrated in FIG. 4, the compensation ring 20 is raised relative to the semiconductor wafer 2. Such a raising takes place, for example, during so-called flash processes, during which for the production of thin layers very high heating-up rates of up to 400° C. per second are necessary, and after a maximum temperature has been achieved the temperature is again instantaneously lowered in order to avoid undesired diffusion effects. Such processes are described, for example, in DE 199 52 015 having the title "Method for the thermal treatment of objects" and having the same application date and the same applicant as the present invention, with reference being made to this application to avoid repetition. The movement of the compensation ring can be controlled as a function of the temperature and/or process atmosphere changes described in the previously mentioned application. It is in particular possible to establish a certain phase relationship therebetween. By shifting the compensation ring 20 prior to and/or during the raising and holding of the ring in this position, one produces upon the edges of the wafers a shadow relative to light radiation that is incident at an angle from the outside, and thus prevents a too rapid heating up of the rim portion. During the subsequent cooling-off phase, the ring 20 is again brought into the position shown in FIG. 3 in order to prevent a too rapid cooling-off of the rim portion, as a result of which the homogeneity of the temperature distribution over the surface of the wafer is considerably improved.

Although the compensation ring 20 was illustrated as being movable in FIGS. 3 and 4, this ring could also be rigidly disposed, and during the thermal treatment the wafer 2 could be moved relative to the compensation ring 20, for example via adjustable spacers 13. A movement of the light-transforming plates would also be conceivable in order to achieve a relative movement between the wafer 2 and the compensation ring 20.

Figure 5:
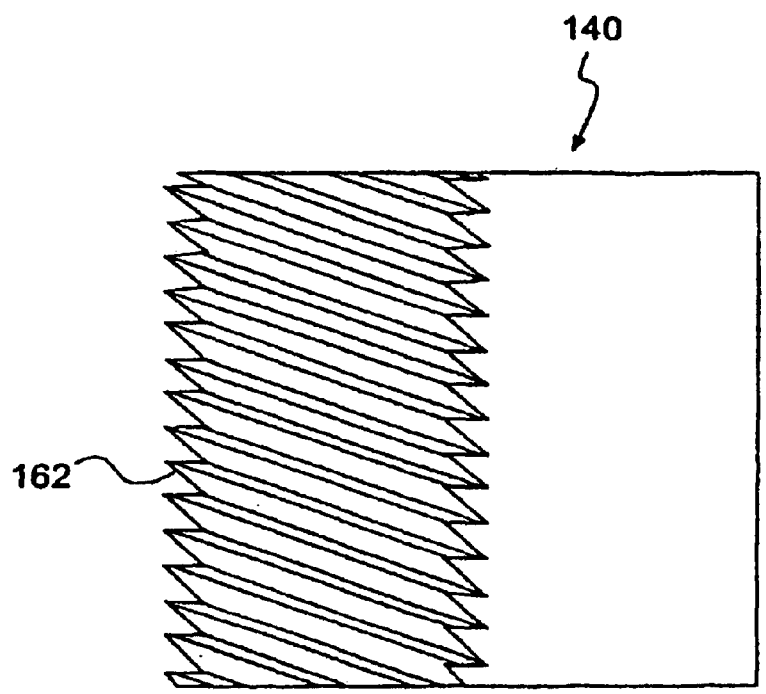
FIG. 5 a schematic side view of an apparatus for the thermal treatment of semiconductor wafers pursuant to a third embodiment of the present invention.
Figure 6:
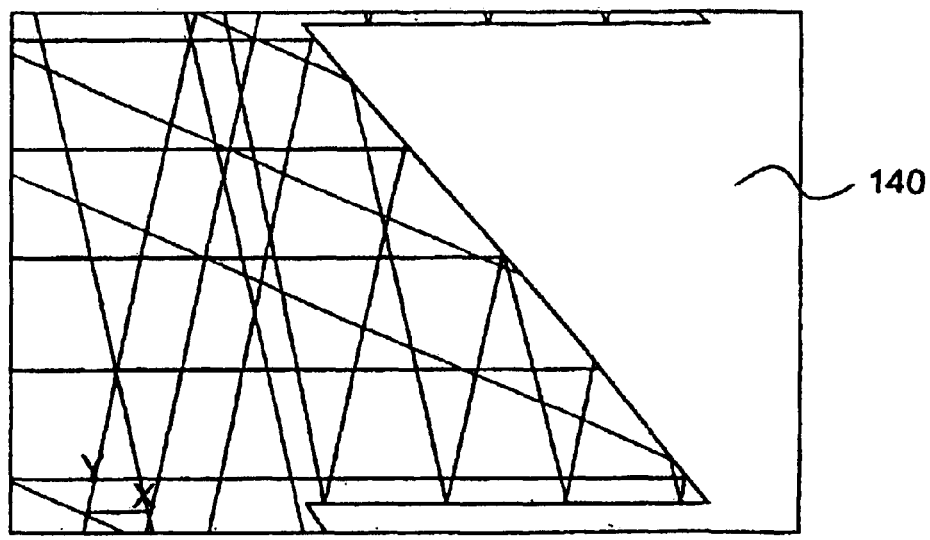
FIG. 6 a schematic plan view of the apparatus of FIG. 5.

FIGS. 5 and 6 illustrate a further embodiment of an apparatus 1 for the thermal treatment of semiconductor wafers 2. In FIGS. 5 and 6 the same reference numerals are used as with the first embodiment to the extent that the same or similar components are in question.

The apparatus 1 again has a process chamber 3 that is formed by upper and lower light-permeable wall elements 5, 6. Again provided in reflector chambers are upper and lower banks of lights that are adjacent to the upper and lower walls 5,6 that delimit the process chamber. In contrast to the previous embodiments, however, in the embodiment pursuant to FIG. 5 no light-transforming plate is provided in the process chamber. By means of spacers 13, which extend from the lower light-permeable wall 5, the wafer 2 is held centrally within the process chamber 3, and in particular parallel to the lower and upper walls 5,6. A compensation ring 25, which is comprised of four ring segments 25a–d as illustrated in FIG. 6, is held within the process chamber 3 in a suitable manner. As can be seen in FIG. 5, the compensation ring 25 is disposed at an angle relative to the wafer 2 in order to produce a shadow effect in the edge regions of the wafer, especially during the heating up of the wafer. The compensation ring could be rigidly held in this position.

However, as with the preceding embodiments, it is also possible to make the compensation ring 25 movable in order to vary its position during the thermal treatment. In this connection, the individual ring segments 25a–d can be moved individually, all together, or also in pairs. In particular, it is possible for example, to move the ring segments 25a and 25c that are disposed diametrically across from one another together in order to provide a certain symmetry relative to the wafer 2. In the same manner, the ring segments 25b and 25d that are disposed diametrically across from one another could be simultaneously moved. Instead of a tilting of the compensation ring, as is illustrated in FIG. 5, the compensation ring, or individual segments thereof, could also be raised or lowered, as illustrated by way of example in FIG. 4. Of course, the number of segments need not be limited to four, and more or fewer segments could also be provided.

Figure 7:
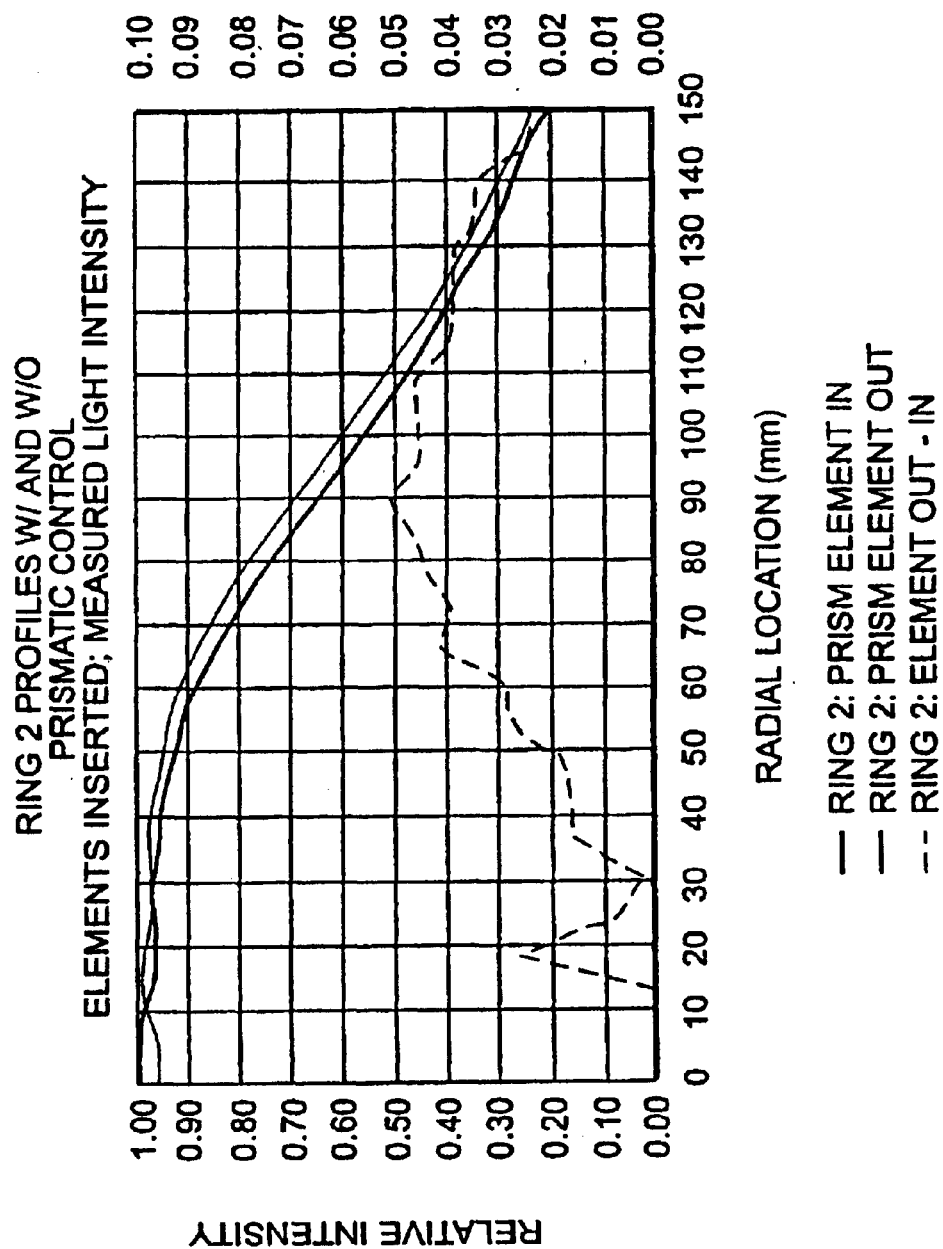
FIG. 7 a graph that shows the position of an element of the inventive apparatus that influences the temperature distribution as a function of a temperature curve of the thermal treatment.

FIG. 7 shows the temperature curve of a thermal treatment of a semiconductor wafer plotted against time, as well as a movement of a compensation ring, as it is illustrated in FIG. 5, controlled as a function thereof. At the beginning of the thermal treatment, the compensation ring 25 is disposed in essentially the same plane as the wafer 2. As the temperature increases, the compensation ring is tilted relative to the plane of the wafer, whereby the tilt angle is correlated with the curve of the temperature in terms of time, and increases, for example, with an increase in the heating rate. The temperature is increased up to a maximum, and the temperature is subsequently immediately again reduced. During the temperature decline, the compensation ring is tilted back. The cooling-off of the wafer is stopped at a temperature T', and the wafer is kept at this temperature. At this point in time, the compensation ring is again parallel to the wafer and thus prevents an excessive cooling of the rim portions of the wafer.

As a consequence of the above movement of the compensation ring, a shadow is produced upon the edges of the wafer during the heating phase in order to prevent a rapid heating-up of the edge region. As a result, the homogeneity of the temperature distribution over the wafer surface is improved. A further improvement of the homogeneity can be achieved by an additional wafer rotation and/or by regulating the radiation intensity of the heat lamps.

Figure 8:
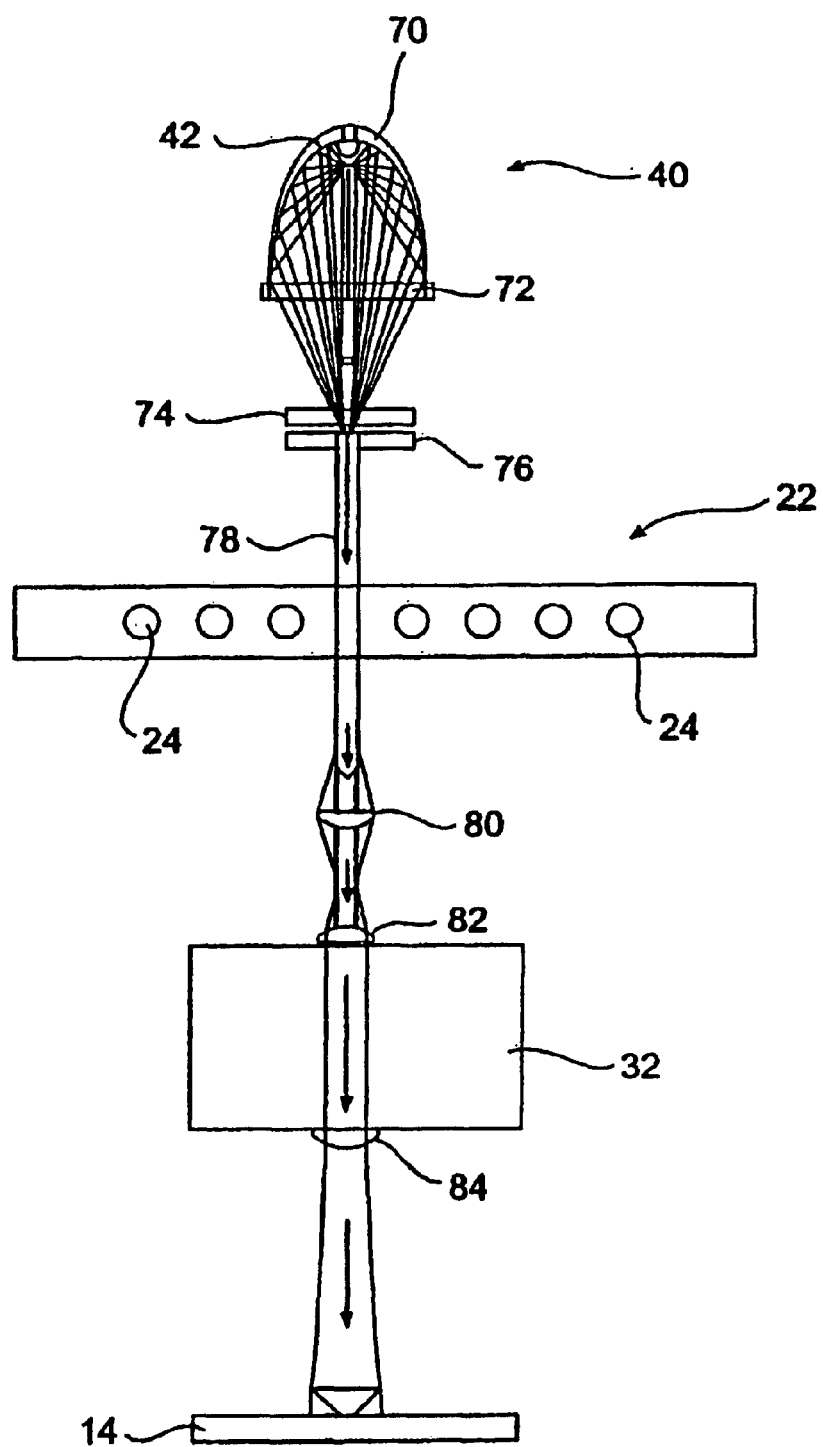
FIG. 8 a graph in which is plotted a further embodiment for the temperature curve as a function of time.
Figure 1:
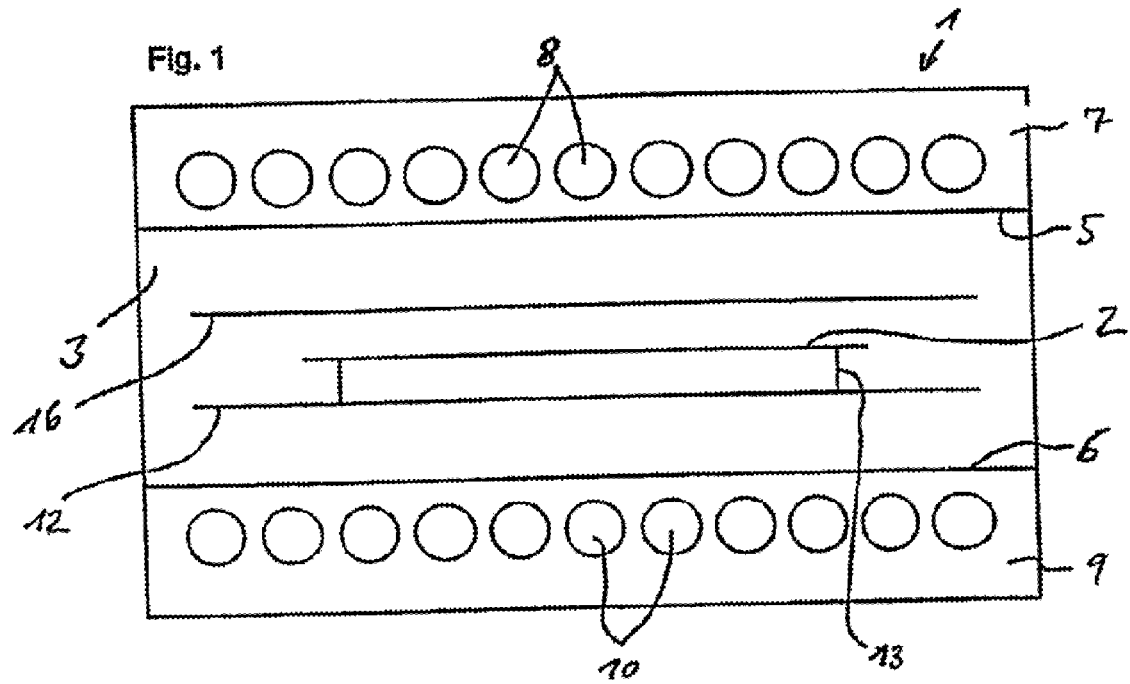
Figure 2:
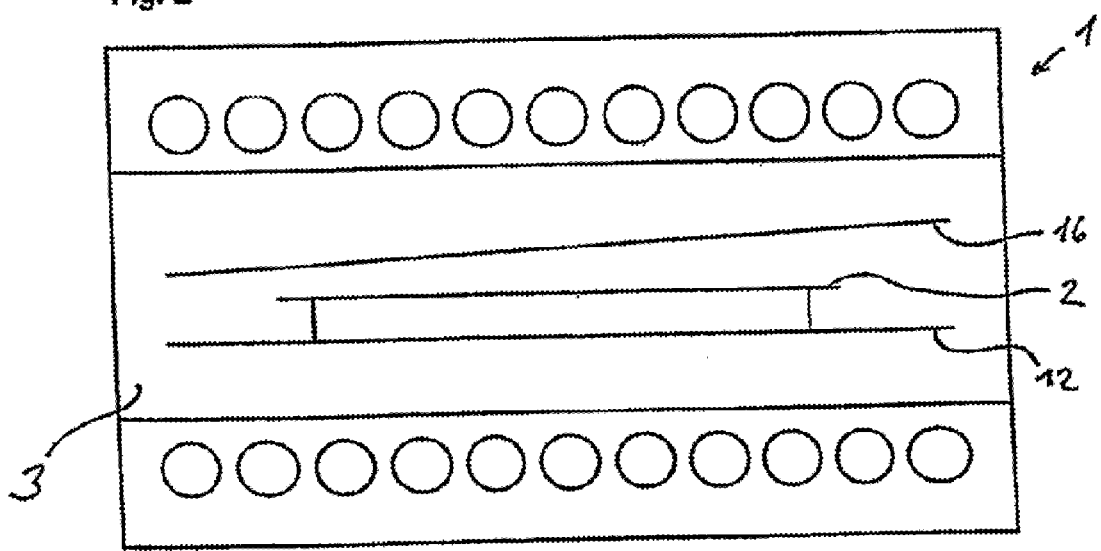
Figure 3:
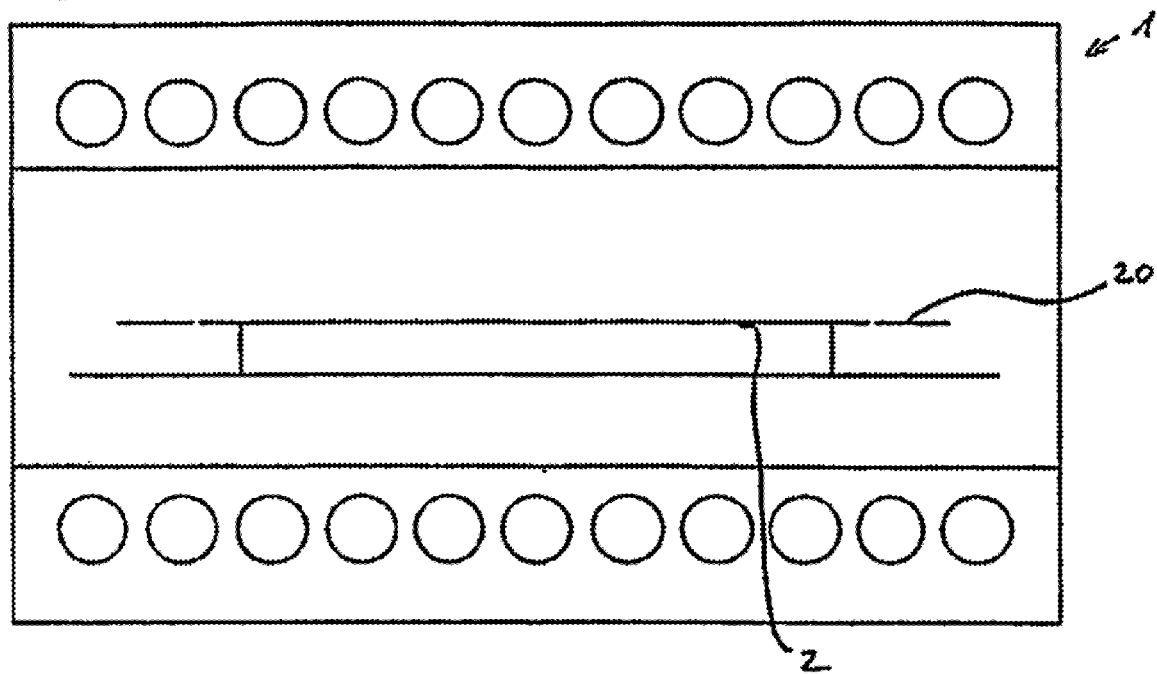
Figure 4:
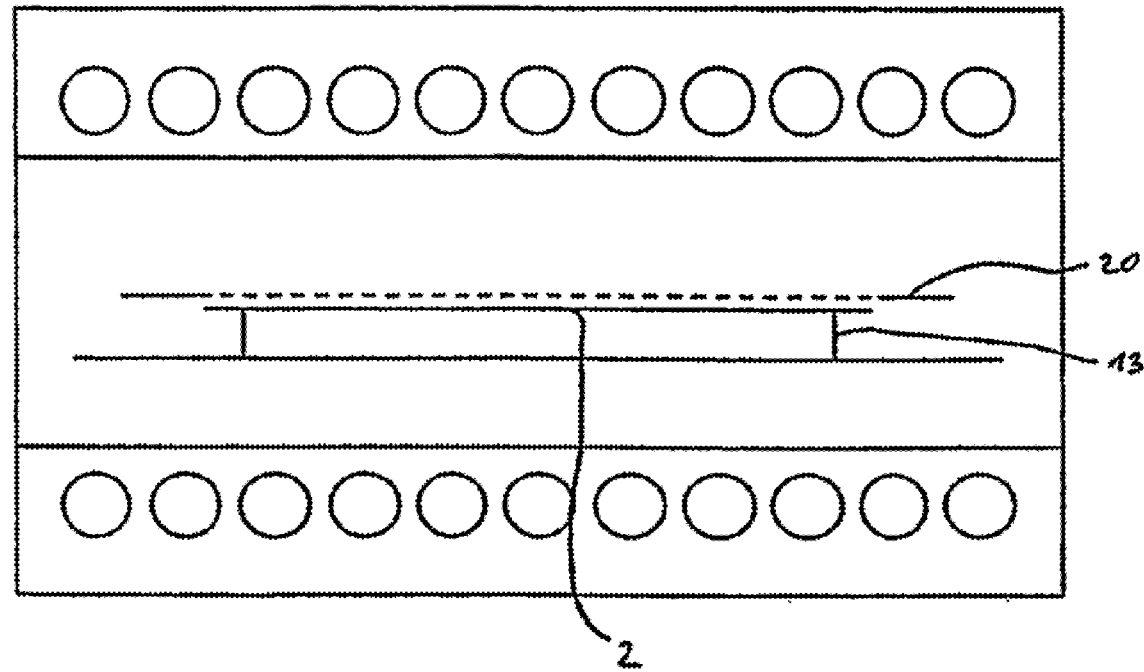
Figure 5:
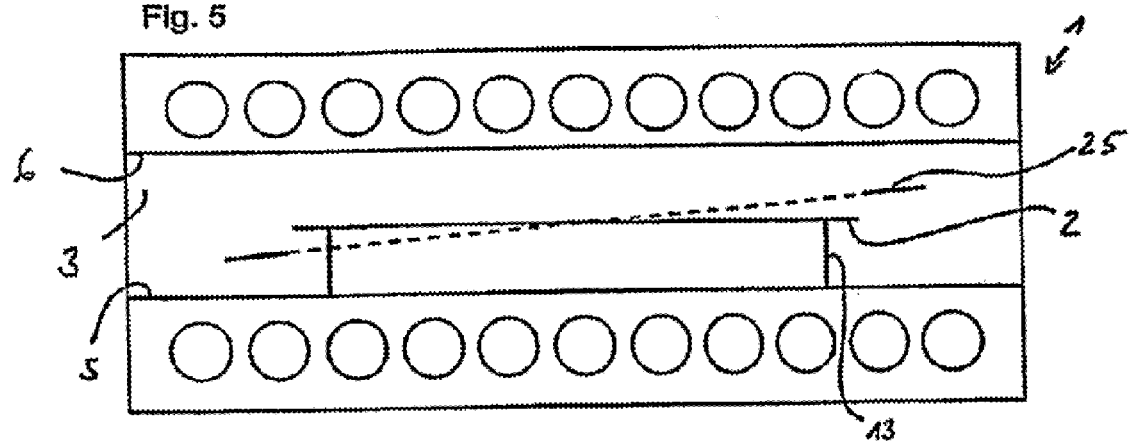
Figure 6:
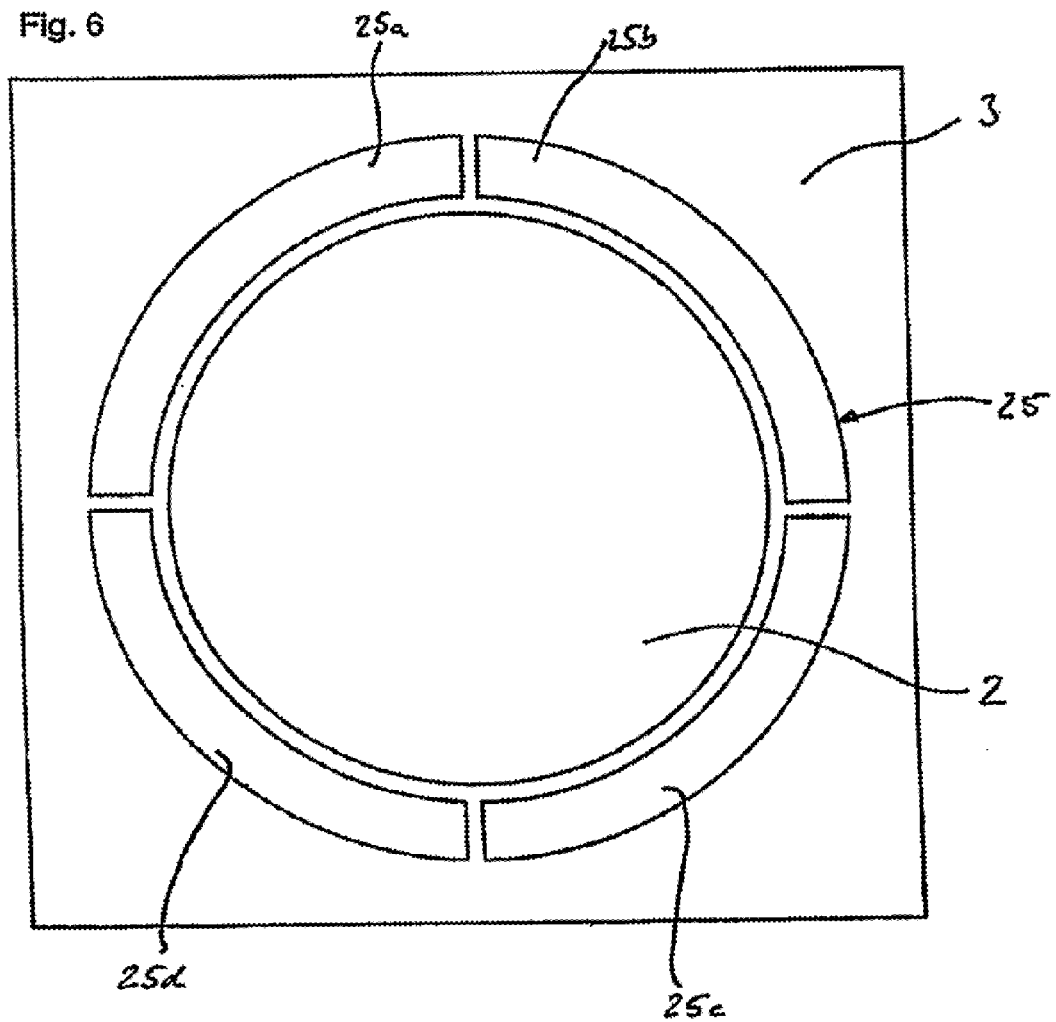
Figure 7:
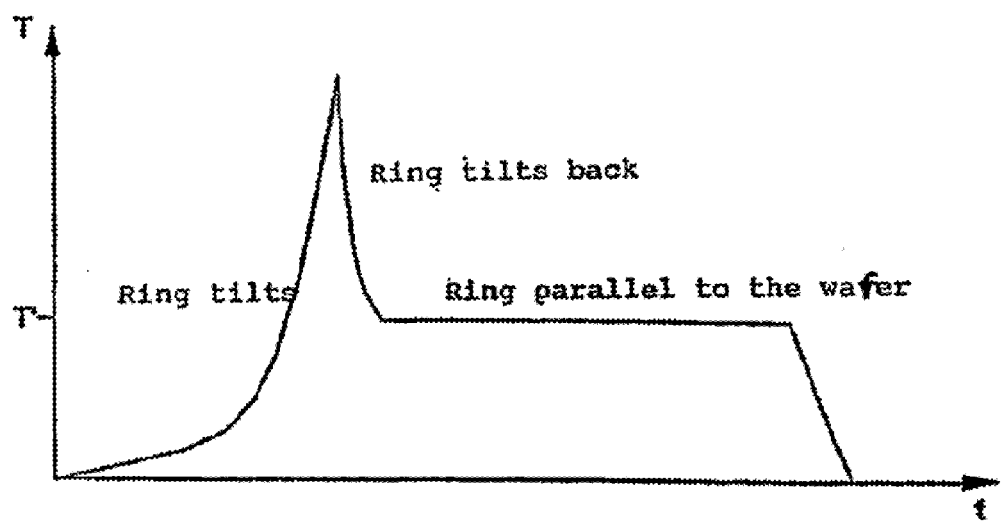
Figure 8:
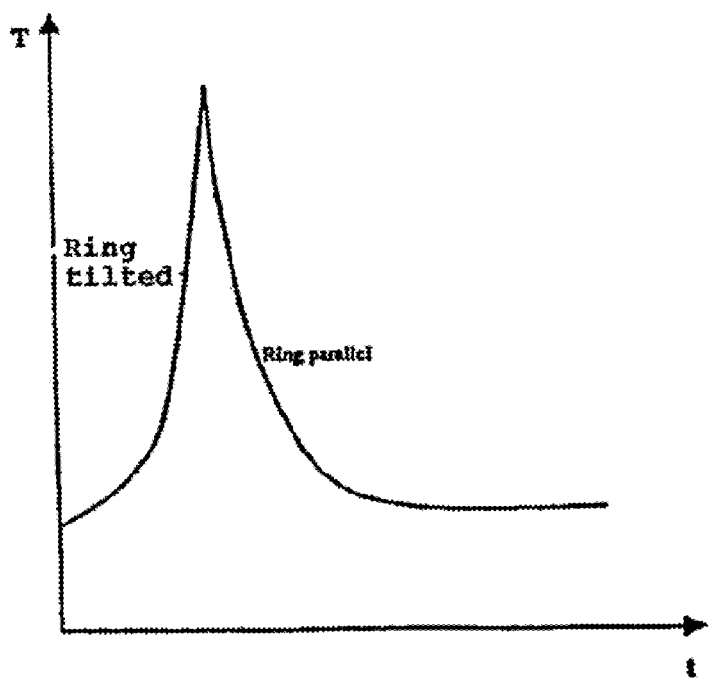

This improved homogeneity is in particular necessary during so-called flash processes, with which very high heating-up rates occur. With these processes, the banks of lamps of the apparatus generally operate at full capacity, which frequently leads to inhomogeneities, especially in the rim regions. In this connection, the wafers are heated very rapidly to about 900° C. to 1150° C. The ramp rates with which the wafers are heated up are in the range of 150° C./s to 500° C./s. After the heating-up, the wafer is subsequently rapidly again cooled off. FIG. 8 schematically illustrates such a flash process. With movement of the compensation element during such a flash process, there was achieved a reduction of the standard deviation of the average temperature value over the wafer from 3% to 1%.

Such processes are used in particular for the activation of implanted (doped) wafers, whereby these activation processes require a very great temperature homogeneity, especially with doping at low depths of penetration.

In addition to being improved by wafer rotation, the aforementioned homogeneity can also be further improved by additional measures such as controlling the lamps. Thus, in FIGS. 1–5 an upper bank of lamps 8 and a lower bank of lamps 9 having, for example, rod-shaped lamps, are illustrated. The axes of the lamps preferably extend parallel to each other. In the Figures, the rod-shaped lamps, which are disposed parallel, reach into the plane of the drawing sheet. Lamps that can be used for such a lamp panel are, for example, halogen lamps. In FIG. 5, the tilt axis of the compensation ring 25 extends parallel to the rod lamps. With this arrangement, the shadow cast by the compensation ring upon the wafer nearly vanishes in the vicinity of its tilt axis, whereas it is maximum at the wafer edges that are disposed diametrically opposite this axis. Since the radiation intensity of the central lamps of the bank of lamps is suitably weaker than that of the outer lamps, there results a radiation profile that is conducive to the homogeneity of the temperature distribution of the wafer.

With another embodiment, the pivot axis for the tilting of the compensation element, rather than extending parallel to the lamp axis of the bank of lamps, forms therewith an angle, preferably 90°. Since the holding device for wafer and auxiliary element is rotatable, it is possible to control the angle between tilt axis of the compensation element and the lamp axis during the process as a function of the progress of the process.

In addition, the lamp axis of the halogen lamps of the upper and lower lamp panel can be disposed parallel as well as crossing one another at any desired angle.

A combination of a lamp panel having rod lamps and a lamp panel having point lamps is also possible. The term point lamps, in contrast to rod lamps, includes lamps the filament lengths of which are shorter than the diameter of the lamp bulb. Of course, both lamp panels could also be equipped exclusively with point lamps or with a combination of point lamps and rod lamps. Depending upon the special requirements, it is thus possible, by controlling each individual lamp, to produce a specific radiation field that in combination with the relative spatial arrangement of the wafer at any given time, and of the mechanical auxiliary elements relative to the banks of lamps, optimizes the homogeneity of the temperature of the wafer.

Although with the process curve of FIG. 7 the compensation ring was tilted as a unit, in addition to the tilting movement it is also possible to displace the ring in any direction. In a similar manner, individual segments of the compensation ring could also be moved. Instead of a movement of the compensation ring, it is also possible to move the wafer itself relative to the compensation ring.

If a plurality of elements that influence the temperature distribution, such as, for example, a compensation ring and a hotliner, are provided in the process chamber 3, as in the embodiment of FIG. 4, it is also possible to move both elements, i.e. the compensation ring and the light-transforming plate, in order to influence the thermal distribution within the process chamber. The features of individual ones of the embodiments can be freely combined with the features of the other embodiments.

The specification incorporates by reference the disclosure of German priority document 199 52 017.8 filed Oct. 28, 1999, and International priority document PCT/EP00/10290 filed Oct. 19, 2000.

The present invention is, of course, in no way restricted to the specific disclosure of the specification and drawings, but also encompasses any modifications within the scope of the appended claims.

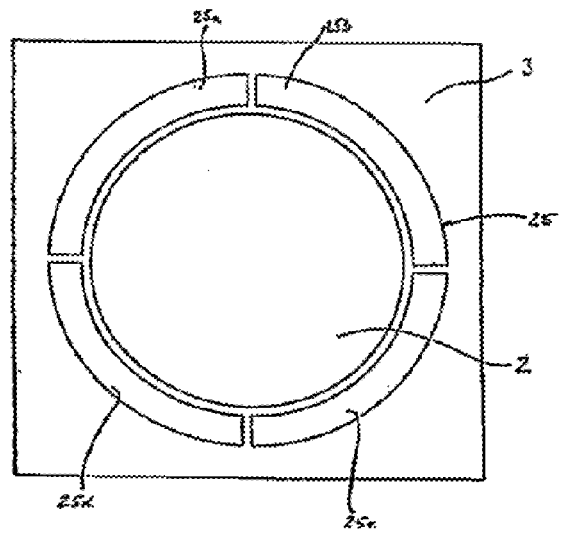

What is claimed is:

1. A method of thermally treating substrates in a process chamber having therein at least one element that influences a temperature distribution, wherein said element comprises at least one of compensation member that is adapted to surround a substrate, and a light-transforming plate that is spaced from a substrate, said method including the step of:

during a thermal treatment, varying a spatial arrangement of said at least one element, which is a passive element, relative to at least one of a substrate and said process chamber.

2. A method according to claim 1, wherein a relative movement for said varying of said arrangement is controlled as a function of a temperature curve of said thermal treatment.

3. A method according to claim 1, wherein said at least one element is moved relative to at least one of a substrate and said process chamber.

4. A method according to claim 3, wherein said movement is at least one of a tilting movement, a pivoting movement and a displacement movement.

5. A method according to claim 1, wherein said element is a compensation element, especially a compensation ring, which at least partially surrounds a substrate in a plane that is parallel to said substrate.

6. A method according to claim 1, wherein said element is comprised of a plurality of segments, especially ring segments, and wherein at least one of said segments is moved.

7. A method according to claim 6, wherein a movement of each segment is controlled as a function of an arrangement of at least one other segment.

8. A method according to claim 6, wherein at least two segments are moved simultaneously.

9. A method according to claim 8, wherein said segments are disposed diametrically across from one another in pairs relative to said substrate, and wherein said segment pairs are moved simultaneously.

10. A method according to claim 1, wherein the spatial arrangement of at least two elements is varied relative to at least one of a substrate and said process chamber.

11. A method according to claim 1, wherein at least one element and a substrate are moved.

12. An apparatus for thermally treating substrates, comprising:

a process chamber having therein at least one passive element that influences a temperature distribution, wherein said element is in the form of at least one of a compensation member that is adapted to surround a substrate, and a light-transforming plate that is spaced from a substrate; and means for varying a spatial arrangement of said at least one element relative to at least one of a substrate and said process chamber during a thermal treatment.

13. An apparatus according to claim 12, which includes means for controlling said spatial arrangement as a function of a temperature curve of said thermal treatment.

14. An apparatus according to claim 12, wherein means are provided for moving said at least one element relative to at least one of said substrate and said process chamber.

15. An apparatus according to claim 14, wherein said movement is at least one of a tilting movement, a pivoting movement and a displacement movement.

16. An apparatus according to claim 12, wherein said element is a compensation member in the form of a com pensation ring that surrounds a substrate in a plane that is parallel to said substrate.

17. An apparatus according to claim 16, wherein said compensation ring is disposed at an angle to said plane of said substrate.

18. An apparatus according to claim 12, wherein said element comprises a plurality of segments, especially ring segments, and wherein means are provided for moving at least one of said segments.

19. An apparatus according to claim 12, wherein said spatial arrangement of at least two elements is variable relative to at least one of a substrate and said process chamber.

20. An apparatus according to claim 12, wherein at least one element and a substrate are movable.

* * * * *

UNITED STATES PATENT AND TRADEMARK OFFICE
CERTIFICATE OF CORRECTION

| | | |
|---|---|---|
| PATENT NO. | : 7,041,610 B1 | |
| APPLICATION NO. | : 10/111737 | |
| DATED | : May 9, 2006 | |
| INVENTOR(S) | : Andreas Tillmann | |

It is certified that error appears in the above-identified patent and that said Letters Patent is hereby corrected as shown below:

The Title Page, showing an illustrative figure, should be deleted and substitute therefor the attached title page.

Delete drawings sheet 1-4 and substitute therefor the drawing sheets, consisting of figs. 1-8 as shown on the attached page.

Signed and Sealed this

Seventh Day of August, 2007

JON W. DUDAS
*Director of the United States Patent and Trademark Office*

(12) United States Patent
Tillmann et al.

(10) Patent No.: US 7,041,610 B1
(45) Date of Patent: May 9, 2006

(54) METHOD AND APPARATUS FOR THE THERMAL TREATMENT OF SUBSTRATES

(75) Inventors: Andreas Tillmann, Tomerdingen (DE); Uwe Kreiser, Ulm (DE)

(73) Assignee: Steag RTP Systems GmbH (DE)

(*) Notice: Subject to any disclaimer, the term of this patent is extended or adjusted under 35 U.S.C. 154(b) by 198 days.

(21) Appl. No.: 10/111,737

(22) PCT Filed: Oct. 19, 2000

(86) PCT No.: PCT/EP00/10290

§ 371 (c)(1),
(2), (4) Date: Sep. 17, 2002

(87) PCT Pub. No.: WO01/31689

PCT Pub. Date: May 3, 2001

(Under 37 CFR 1.47)

(30) Foreign Application Priority Data

Oct. 28, 1999 (DE) .................. 199 52 017

(51) Int. Cl.
H01L 21/26 (2006.01)
H01L 21/324 (2006.01)
H01L 21/42 (2006.01)

(52) U.S. Cl. ............ 438/795; 438/308; 438/799; 250/492.2; 250/492.22

(58) Field of Classification Search .......... 438/308, 438/795, 799; 250/492.2, 492.22
See application file for complete search history.

(56) References Cited

U.S. PATENT DOCUMENTS

| 4,891,488 A | 1/1990 | Davis et al. |
| 4,958,061 A * | 9/1990 | Wakabayashi et al. ...... 219/411 |
| 4,981,815 A * | 1/1991 | Kakoschke ...................... 438/5 |
| 5,253,324 A | 10/1993 | Wortman et al. |
| 2002/0017618 A1 * | 2/2002 | Gat et al. ................. 250/492.2 |

FOREIGN PATENT DOCUMENTS

| DE | 4223133 | 1/1993 |
| DE | 4437361 | 4/1996 |
| DE | 19737802 | 3/1999 |
| DE | 19821007 | 11/1999 |
| WO | WO 00/41223 | 7/2000 |

* cited by examiner

*Primary Examiner*—Amir Zarabian
*Assistant Examiner*—Pamela Perkins
(74) *Attorney, Agent, or Firm*—R W Becker & Associates; R. W. Becker

(57) ABSTRACT

In order to achieve temperature distribution, in particular a homogeneous temperature distribution in, for example, a substrate during a thermal treatment process of said substrate, a method is disclosed for the thermal treatment of substrates, in particular semi-conductor wafers, in a process chamber comprising at least one temperature distribution influencing element located in the process chamber. During thermal treatment, the spatial arrangement of the element is altered relative to the substrate and/or to the process chamber. A device for the thermal treatment of substrates in a process chamber is also disclosed, comprising at least one temperature distribution influencing element located in a process chamber wherein a device is provided in order to alter the spatial arrangement of the element relative to the substrate and/or to the process chamber during the thermal treatment process.

20 Claims, 7 Drawing Sheets